(12) United States Patent
Myung et al.

(10) Patent No.: US 8,922,008 B2
(45) Date of Patent: Dec. 30, 2014

(54) BUMP STRUCTURE, HAVING CONCAVE LATERAL SIDES, SEMICONDUCTOR PACKAGE HAVING THE BUMP STRUCTURE, AND METHOD OF FORMING THE BUMP STRUCTURE

(71) Applicant: Samsung Electronics Co., Ltd., Suwon-si (KR)

(72) Inventors: Jong-Yun Myung, Seoul (KR); Yong-Hwan Kwon, Suwon-si (KR); Jong-Bo Shim, Asan-si (KR); Moon-Gi Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/834,475

(22) Filed: Mar. 15, 2013

(65) Prior Publication Data
US 2013/0292822 A1    Nov. 7, 2013

(30) Foreign Application Priority Data

May 7, 2012   (KR) ........................ 10-2012-0047896

(51) Int. Cl.
| | |
|---|---|
| *H01L 23/498* | (2006.01) |
| *H01L 23/00* | (2006.01) |
| *H01L 23/31* | (2006.01) |
| H01L 25/065 | (2006.01) |
| H01L 23/48 | (2006.01) |

(52) U.S. Cl.
CPC .......... *H01L 23/49811* (2013.01); *H01L 24/11* (2013.01); *H01L 23/3128* (2013.01); *H01L 24/05* (2013.01); *H01L 24/13* (2013.01); *H01L 25/0657* (2013.01); *H01L 2225/06517* (2013.01); *H01L 2225/06513* (2013.01); *H01L 2225/06541* (2013.01); *H01L 2225/06565* (2013.01); *H01L 23/481* (2013.01); *H01L 23/49816* (2013.01); *H01L 2924/15311* (2013.01); *H01L 2224/13084* (2013.01); *H01L 24/03* (2013.01); *H01L 24/16* (2013.01);

(Continued)

(58) Field of Classification Search
USPC .................. 257/737, 778, 738, 772, E23.021, 257/E23.146, E23.02, 734, 784, 786, 780, 257/779, 783, 782
See application file for complete search history.

(56) References Cited

U.S. PATENT DOCUMENTS

| | | | | |
|---|---|---|---|---|
| 5,640,052 | A | * | 6/1997 | Tsukamoto .................... 257/781 |
| 5,889,326 | A | * | 3/1999 | Tanaka .......................... 257/737 |

(Continued)

FOREIGN PATENT DOCUMENTS

| | | |
|---|---|---|
| JP | 2004-207685 | 7/2004 |
| JP | 2011-138913 | 7/2011 |

(Continued)

*Primary Examiner* — Alexander Oscar Williams
(74) *Attorney, Agent, or Firm* — Ellsworth IP Group PLLC (57) ABSTRACT

A bump structure includes a first bump and a second bump. The first bump is disposed on a connection pad of a substrate. The first bump includes a lower portion having a first width, a middle portion having a second width smaller than the first width, and an upper portion having a third width greater than the second width. The second bump is disposed on the upper portion of the first bump.

14 Claims, 10 Drawing Sheets

(52) U.S. Cl.
CPC . *H01L 2224/0345* (2013.01); *H01L 2224/0401* (2013.01); *H01L 2224/05009* (2013.01); *H01L 2224/05022* (2013.01); *H01L 2224/05166* (2013.01); *H01L 2224/05171* (2013.01); *H01L 2224/0557* (2013.01); *H01L 2224/05647* (2013.01); *H01L 2224/05655* (2013.01); *H01L 2224/05664* (2013.01); *H01L 2224/1146* (2013.01); *H01L 2224/13025* (2013.01); *H01L 2224/13111* (2013.01); *H01L 2224/13147* (2013.01); *H01L 2224/13155* (2013.01); *H01L 2224/16146* (2013.01); *H01L 2224/16235* (2013.01); *H01L 2224/16237* (2013.01); *H01L 2224/81815* (2013.01); *H01L 2224/05568* (2013.01); *H01L 2224/03912* (2013.01); *H01L 2224/11472* (2013.01); *H01L 2224/05572* (2013.01)
USPC ........... 257/737; 257/778; 257/738; 257/772; 257/E23.021; 257/E23.146; 257/E23.02; 257/734; 257/784; 257/786; 257/780; 257/779; 257/783; 257/782

(56) References Cited

U.S. PATENT DOCUMENTS

| | | | |
|---|---|---|---|
| 6,225,205 B1* | 5/2001 | Kinoshita | 438/613 |
| 6,638,847 B1 | 10/2003 | Cheung et al. | |
| 7,368,379 B2 | 5/2008 | Tsao et al. | |
| 7,868,440 B2* | 1/2011 | Roberts et al. | 257/686 |
| 7,915,088 B2* | 3/2011 | Kobayashi et al. | 438/125 |
| 7,993,970 B2* | 8/2011 | Tsai | 438/108 |
| 8,143,718 B2* | 3/2012 | Egawa | 257/723 |
| 8,183,469 B2* | 5/2012 | Sunohara et al. | 174/267 |
| 8,525,350 B2* | 9/2013 | Pendse | 257/781 |
| 2001/0019173 A1* | 9/2001 | Taguchi et al. | 257/737 |
| 2002/0047212 A1* | 4/2002 | Chen | 257/777 |
| 2004/0121267 A1 | 6/2004 | Jang | |
| 2005/0127508 A1* | 6/2005 | Lee et al. | 257/737 |
| 2006/0051954 A1* | 3/2006 | Lin et al. | 438/614 |
| 2006/0276022 A1 | 12/2006 | Li et al. | |
| 2007/0023924 A1* | 2/2007 | Funaki | 257/778 |
| 2007/0052109 A1 | 3/2007 | Chen et al. | |
| 2007/0205512 A1* | 9/2007 | Lee et al. | 257/738 |
| 2009/0045523 A1* | 2/2009 | Fan et al. | 257/777 |
| 2009/0127708 A1 | 5/2009 | Lee et al. | |
| 2009/0183911 A1* | 7/2009 | Sunohara et al. | 174/267 |
| 2009/0243096 A1* | 10/2009 | Tsai | 257/737 |
| 2010/0308403 A1 | 12/2010 | Jang et al. | |
| 2010/0312954 A1 | 12/2010 | Jeon et al. | |
| 2010/0323241 A1 | 12/2010 | Kawakami et al. | |
| 2011/0001250 A1 | 1/2011 | Lin et al. | |
| 2011/0002178 A1 | 1/2011 | Hwang et al. | |
| 2011/0007439 A1 | 1/2011 | Asakawa et al. | |
| 2011/0021970 A1 | 1/2011 | Vo-Dinh et al. | |
| 2011/0031947 A1 | 2/2011 | You | |
| 2011/0068427 A1 | 3/2011 | Paek et al. | |
| 2011/0079896 A1* | 4/2011 | Satoh et al. | 257/737 |
| 2011/0084381 A1 | 4/2011 | Lo et al. | |
| 2011/0084387 A1 | 4/2011 | Dubin et al. | |
| 2011/0084389 A1 | 4/2011 | Lo et al. | |
| 2011/0085264 A1 | 4/2011 | Hauet et al. | |
| 2011/0101527 A1 | 5/2011 | Cheng et al. | |
| 2011/0121096 A1 | 5/2011 | Nihei et al. | |
| 2011/0124139 A1 | 5/2011 | Chang | |
| 2011/0133344 A1 | 6/2011 | Nguyen et al. | |
| 2011/0156256 A1 | 6/2011 | Kang et al. | |
| 2011/0162876 A1 | 7/2011 | Arvin et al. | |
| 2011/0165506 A1 | 7/2011 | Stanton et al. | |
| 2011/0170331 A1 | 7/2011 | Oh et al. | |
| 2013/0087906 A1* | 4/2013 | Cheng et al. | 257/737 |
| 2013/0228916 A1* | 9/2013 | Mawatari | 257/737 |

FOREIGN PATENT DOCUMENTS

| | | |
|---|---|---|
| KR | 10-0568006 | 6/2005 |
| KR | 2009-0009414 | 1/2009 |
| KR | 2009-0050635 | 5/2009 |
| KR | 2010-0104484 | 9/2010 |
| KR | 2011-0002816 | 1/2011 |

* cited by examiner

BUMP STRUCTURE, HAVING CONCAVE LATERAL SIDES, SEMICONDUCTOR PACKAGE HAVING THE BUMP STRUCTURE, AND METHOD OF FORMING THE BUMP STRUCTURE

CROSS-REFERENCE TO RELATED APPLICATIONS

This application claims priority under 35 U.S.C. §119 to Korean Patent Application No. 2012-47896, filed on May 7, 2012 in the Korean Intellectual Property Office (KIPO), the entire contents of which are herein incorporated by reference.

BACKGROUND

1. Field

Exemplary embodiments of the present general inventive concept relate to a bump structure, a semiconductor package having the bump structure, and a method of forming the bump structure. More particularly, exemplary embodiments of the present general inventive concept relate to a bump structure to form an electrical connection between semiconductor devices, a semiconductor package having the bump structure, and a method of forming the bump structure.

2. Description of the Related Art

A conventional semiconductor package may include an electrical connection medium to electrically connect a semiconductor chip and a mounting substrate. Examples of the electrical connection medium may be a conductive wire, a bump, etc. A semiconductor package having a structure where the semiconductor chip is connected by a plurality of the bumps is called a flip-chip package.

Recently, as a number of input/output signal lines within the semiconductor chip is increased according to a miniaturization trend of electronic products using semiconductor devices, dimensions and pitches of connection pads thereof also decrease in size. When the bump, being typically made of copper, has a pillar shape or triangular shape, heat or an impact force produced during manufacture of the semiconductor device may be transferred to a connection pad that is connected to the bump, and thus, cracking or peeling of the connection pad may occur frequently.

SUMMARY

The present general inventive concept provides a bump structure capable of electrically connecting semiconductor devices including connection pads with fine pitches, a semiconductor package having the bump structure, and a method of forming the bump structure.

Additional features and utilities of the present general inventive concept will be set forth in part in the description which follows and, in part, will be obvious from the description, or may be learned by practice of the general inventive concept.

The foregoing and/or other features and utilities of the present general inventive concept are achieved by providing a bump structure including a first bump disposed on a connection pad of a substrate and including a lower portion having a first width, a middle portion having a second width smaller than the first width, and an upper portion having a third width greater than the second width, and a second bump disposed on the upper portion of the first bump.

In example embodiments, the lower portion of the first bump may include a first conductive material, the middle portion of the first bump may include a second conductive material, and the upper portion of the first bump may include a third conductive material.

In example embodiments, the first conductive material may have a first ductility, the second conductive material may have a second ductility greater than the first ductility, and the third conductive material may have a third ductility smaller than the second ductility.

In example embodiments, the first conductive material may be substantially the same as the third conductive material.

In example embodiments, the first conductive material and the third conductive material may include copper (Cu).

In example embodiments, the second conductive material may include tin (Sn).

In example embodiments, the second bump may include a fourth conductive material substantially the same as the second conductive material.

In example embodiments, the second bump may have a fourth width greater than the second width.

The foregoing and/or other features and utilities of the present general inventive concept may also be achieved by providing a semiconductor package include a semiconductor chip, a mounting substrate to mount the semiconductor chip, a first bump disposed on a connection pad of the semiconductor chip and including a lower portion extending from the connection pad and having a first width, a middle portion having a second width smaller than the first width, and an upper portion having a third width greater than the second width, and a second bump disposed on the upper portion of the first bump and adhered to a connection pad of the mounting substrate.

In example embodiments, the middle portion of the first bump may include a conductive material having ductility greater than those of the lower portion and the upper portion of the first bump.

The foregoing and/or other features and utilities of the present general inventive concept may also be achieved by providing a method of forming a bump structure, including forming a first bump on a connection pad of a substrate, the first bump including a lower portion having a first width, a middle portion having a second width smaller than the first width, and an upper portion having a third width greater than the second width, and forming a second bump on the upper portion of the first bump.

In example embodiments, forming the first bump may include forming a photoresist layer pattern on the substrate to expose the connection pad, the photoresist pattern including an opening formed therein, a width of a middle sidewall of the opening being smaller than those of a lower sidewall and an upper sidewall of the opening, and filling the opening of the photoresist layer pattern with a conductive material to form the first bump.

In example embodiments, forming the photoresist layer pattern may include forming a photoresist layer on the substrate to cover the connection pad, performing an exposure process on the photoresist layer, and adjusting an exposure focus while performing the exposure process such that the photoresist layer pattern is formed to include the opening having a width varying along its depth.

In example embodiments, the method may further include forming a seed layer on the connection pad.

In example embodiments, filling the opening of the photoresist layer pattern with a conductive material may include performing a first plating process on the seed layer using a first conductive material having a first ductility to form the lower portion of the first bump, performing a second plating process on the lower portion of the first bump using a second conductive material having a second ductility greater than the first ductility to form the middle portion of the first bump, and performing a third plating process on the middle portion of the first bump using a third conductive material having a third ductility smaller than the second ductility to form the upper portion of the first bump.

The foregoing and/or other features and utilities of the present general inventive concept may also be achieved by providing a semiconductor package, including a semiconductor chip, a mounting substrate disposed above the semiconductor chip in a stacking direction to mount the semiconductor chip onto a module substrate, a first bump extending from the semiconductor chip toward the mounting substrate such that lateral sides of the first bump are concave, and a second bump disposed on an end of the first bump that is furthest away from the semiconductor chip to be coupled with the mounting substrate such that lateral sides of the second bump are convex.

In example embodiments, the first bump may have a width in the stacking direction that is larger than a width of the second bump in the stacking direction.

In example embodiments, the first bump may include a lower portion extending from the semiconductor chip and having a first width, a middle portion extending from the lower portion and having a second width smaller than the first width, and an upper portion extending from the middle portion and having a third width greater than the second width.

In example embodiments, the semiconductor package may further include a connection pad to connect the mounting substrate to the second bump.

In example embodiments, the semiconductor package may further include a plurality of solder balls to connect the mounting substrate to the module substrate, and a plurality of connecting pads disposed between the plurality of solder balls, respectively, and the mounting substrate to provide an electrical connection therebetween.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
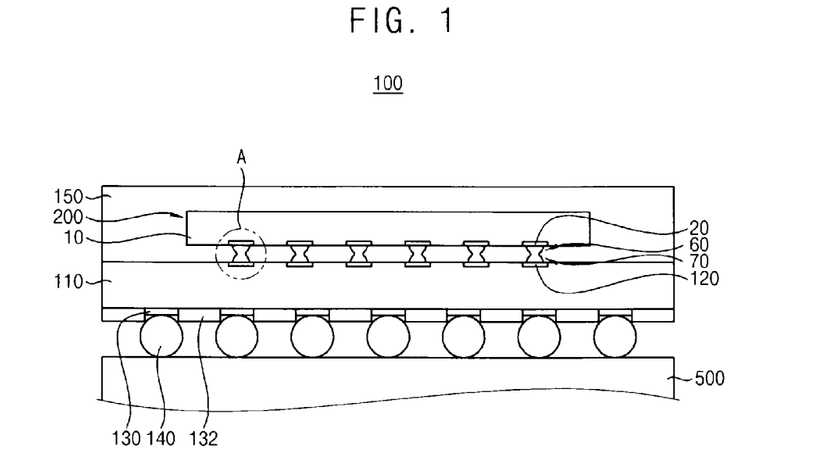
FIG. 1 is a cross-sectional view illustrating a semiconductor package in accordance with an exemplary embodiment of the present general inventive concept.
Figure 2:
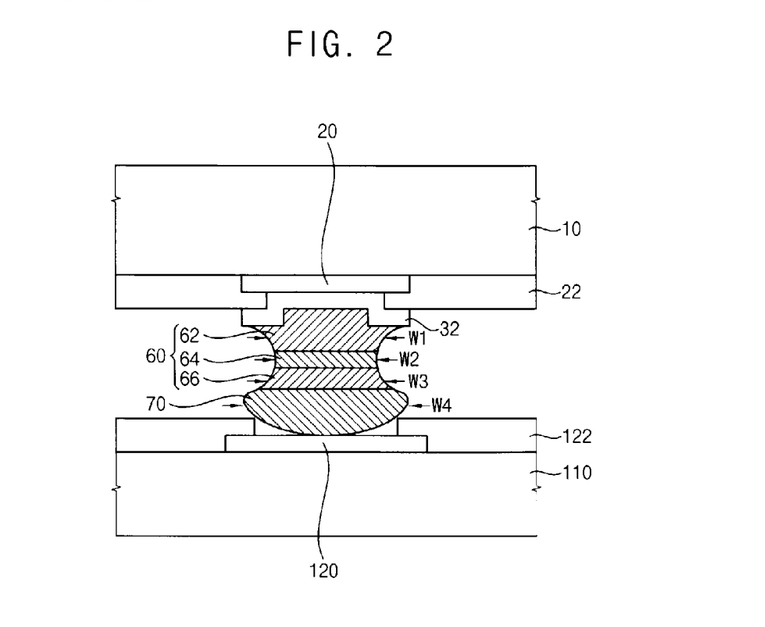
FIG. 2 is an enlarged view illustrating a bump structure in FIG. 1.

FIG. 1 is a cross-sectional view illustrating a semiconductor package in accordance with an exemplary embodiment of the present general inventive concept. FIG. 2 is an enlarged view illustrating a bump structure in FIG. 1. FIG. 2 is an enlarged view illustrating the "A" portion in FIG. 1.

Referring to FIGS. 1 and 2, a semiconductor package 100 includes a mounting substrate 110, a semiconductor chip 200 mounted on the mounting substrate 110, and a bump structure connecting the mounting substrate 110 and the semiconductor chip 200.

The mounting substrate 110 may be a substrate having an upper surface and a lower surface opposite to each other. For example, the mounting substrate 110 may be a printed circuit board (PCB), but is not limited thereto. The PCB may be a multi-layered circuit board having various circuits and vias therein.

Connection pads 120 may be formed on an upper surface of the mounting substrate 110. Outer connection pads 130 may be formed on a lower surface of the mounting substrate 110. The connection pads 120 may be exposed by a first insulation layer pattern 122 and the outer connection pads 130 may be exposed by a second insulation layer pattern 132.

The semiconductor chip 200 may be mounted on the upper surface of the mounting substrate 110. The semiconductor chip 200 may be mounted on and electrically connected to the mounting substrate 110 via a plurality of the bump structures.

The semiconductor chip 200 may include a plurality of circuit elements formed therein. The circuit element may include a plurality of memory devices. Examples of the memory devices may include a volatile memory device and a non-volatile memory device, but are not limited thereto. The volatile memory device may include dynamic random access memory (DRAM), static random access memory (SRAM), etc. The non-volatile memory device may include erasable programmable read-only memory (EPROM), electrically erasable programmable read-only memory (EEPROM), flash EEPROM, etc.

The semiconductor chip 200 may include a substrate 10 having a first surface and a second surface opposite to each other. A connection pad 20 may be formed on the first surface of the substrate 10. The connection pad 20 may be exposed by a third insulation layer pattern 22.

The bump structure may include a first bump 60 and a second bump 70. The first bump 60 may be disposed on the connection pad 20 of the substrate 10 and the second bump 70 may be disposed on the first bump 60 and adhered to the connection pad 120 of the mounting substrate 110. Accordingly, the semiconductor chip 200 may be stacked on and electrically connected to the mounting substrate 110 by a plurality of the bump structures.

The first bump 60 may include a lower portion 62, a middle portion 64 and an upper portion 66 extending in a stacking direction from the connection pad 20. The lower portion 62 of the first bump 60 may have a first width (W1). The middle portion 64 of the first bump 60 may have a second width (W2) smaller than the first width (W1). The upper portion 66 of the first bump 60 may have a third width (W3) greater than the second width (W2). The second bump 70 may have a fourth width (W4) greater than the second width (W2).

The first bump 60 may have a multi-layered structure of different materials. The lower portion 62 of the first bump 60 may include a first conductive material. The middle portion 64 of the first bump 60 may include a second conductive material. The upper portion 66 of the first bump 60 may include a third conductive material. The second bump 70 may include a fourth conductive material.

The first conductive material may have a first ductility. The second conductive material may have a second ductility greater than the first ductility. The third conductive material may have a third ductility smaller than the second ductility. The first conductive material may be substantially the same as the third conductive material. The second conductive material may be substantially the same as the fourth conductive material.

For example, the lower portion 62 of the first bump 60 and the upper portion 66 of the first bump 60 may include copper (Cu), nickel (Ni), etc. The middle portion 64 of the first bump 60 may include tin (Sn). The first bump 60 may have a height of about 1 μm to about 50 μm. The second bump 70 may include tin (Sn), tin/silver (Sn/Ag), tin/copper (Sn/Cu), tin/indium (Sn/In), etc.

Referring to FIG. 2, a seed layer pattern 32 may be formed on the connection pad 22 of the substrate 10. Accordingly, the lower portion 62 of the first bump 60 may extend from the seed layer pattern 32 in a substantially vertical direction with respect to the substrate 10.

A sealing member 150 may be formed to cover the semiconductor chip 200. A solder ball 140 may be disposed on the outer connection pad 130 of the mounting substrate 110. Accordingly, the semiconductor package 100 may be mounted on a module substrate 500 via the solder balls 140 to constitute a memory module (not illustrated).

The semiconductor chip 200 may be mounted on the mounting substrate by the bump structure including the first bump 60 and the second bump 70. The middle portion 64 of the first bump 60 may have a width (or diameter) relatively smaller than the lower portion 62 and the upper portion 66 of the first bump 60. The middle portion 64 of the first bump 60 may have ductility relatively greater than the lower portion 62 and the upper portion 66. Accordingly, the middle portion 64 of the first bump 60 may have hardness relatively smaller than the lower portion 62 and the upper portion 66.

When a tensile stress is exerted on the bump structure in the extending direction, the stress may be transferred to concentrate on the middle portion 64 of the first bump 60 having a relatively small width (diameter) and then may be absorbed in the middle portion 64 of the first bump 60 having a relatively excellent ductility.

Therefore, a stress may be prevented from concentrating on the lower portion 62 that is connected to the connection pad 20, and further, heat or impact may be prevented from being transferred to the connection pad 20 through the lower portion 62 of the first bump 60. Thus, cracking or peeling of the connection pad 20 may be prevented to thereby improve electrical and mechanical reliability of the semiconductor package.

Hereinafter, a method of manufacturing the semiconductor package in FIG. 1 will be explained.

FIGS. 3 through 12 are views illustrating a method of manufacturing a semiconductor package in accordance with an exemplary embodiment of the present general inventive concept.

Figure 3:
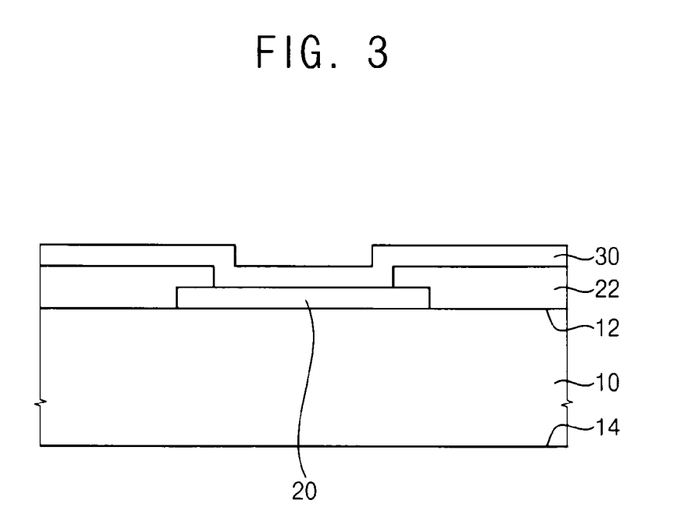
FIGS. 3 through 12 are views illustrating a method of manufacturing a semiconductor package in accordance with an exemplary embodiment of the present general inventive concept.

Referring to FIG. 3, a substrate 10 having preliminary semiconductor chips formed therein may be prepared. The substrate 10 may have a first surface 12 and a second surface 14 opposite to the first surface 12.

In example embodiments, the substrate 10 may be a silicon wafer. The wafer may include a die region and a cutting region. The preliminary semiconductor chip may be formed in the die region. The preliminary semiconductor chips may be diced by a following sawing process to form respective semiconductor chips.

Subsequently, a plurality of connection pads 20 may be formed on the first surface 12 of the substrate 10. The preliminary semiconductor chip may include a plurality of circuit elements formed therein. Input and/or output signals may be input and/or output to and/or from the circuit element through the connection pads 20.

Then, an insulation layer pattern 22 may be formed on the first surface 12 to expose the connection pad 20 and a seed layer 30 may be formed on the connection pad 20.

For example, the insulation layer pattern 22 may include oxide, nitride, etc. These may be used alone or in a combination thereof. The insulation layer pattern 22 may be formed by chemical vapor deposition (CVD) process, plasma enhance chemical vapor deposition (PECVD) process, atomic layer deposition (ALD) process, low pressure chemical vapor deposition (LPCVD) process, sputtering process, etc. Alternatively, the insulation layer pattern 22 may be formed using a polymer material by a spin coating process or a spray process.

The seed layer 30 may include titanium/copper (Ti/Cu), titanium/palladium (Ti/Pd), titanium/nickel (Ti/Ni), chrome/copper (Cr/Cu) or a combination thereof. The seed layer 30 may be formed by a sputtering process.

Figure 4:
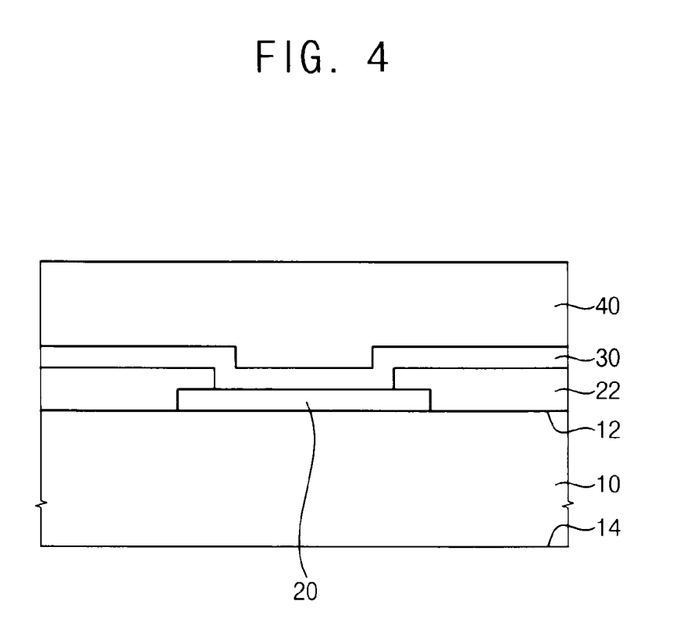

Referring to FIG. 4, a photoresist layer 40 may be formed on the first surface 12 of the substrate 10 to cover the connection pad 20.

For example, the photoresist layer 40 may be formed to have a thickness of about 1 µm to about 50 µm. The thickness of the photoresist layer 40 may be determined in consideration of a height of a bump structure, a process margin, a distance between a semiconductor chip and a mounting substrate, etc.

Figure 5:
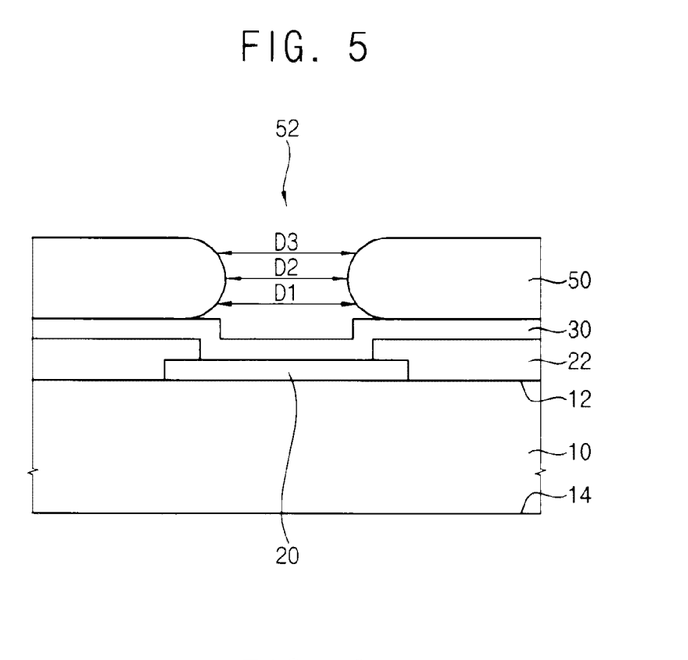
Figure 6:
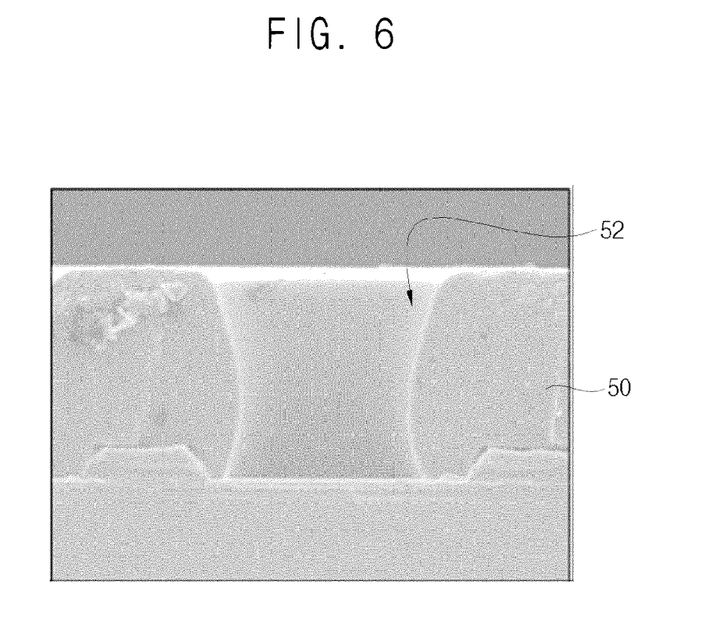

Referring to FIGS. 5 and 6, a photoresist layer pattern 50 may be formed on the first surface 12 of the substrate 10. An exposure process may be performed on the photoresist layer 40 to form the photoresist layer pattern 50 having an opening 52 that exposes the connection pad 20.

While the exposure process is performed, an exposure focus may be adjusted such that the opening 52 of the photoresist layer pattern 50 may have a width varying along its depth. An inclination angle of a sidewall of the opening 52 may be changed along its depth by a change of an exposure focus while performing the exposure process.

FIG. 6 is a scanning electron microscopy (SEM) image representing a photoresist layer pattern formed by an exposure process as described with reference to FIG. 5. The sidewall profile of the opening 52 may be curvilinear. The width (diameter) of the middle portion of the opening 52 may be relatively smaller when compared to a lower portion and an upper portion of the opening 52. As illustrated in FIG. 5, the width (D2) of the middle sidewall of the opening 52 may be smaller than the width (D1) of the lower sidewall, and the width (D2) of the middle sidewall of the opening 52 may be smaller than the width (D3) of the upper sidewall of the opening 52.

Figure 7:
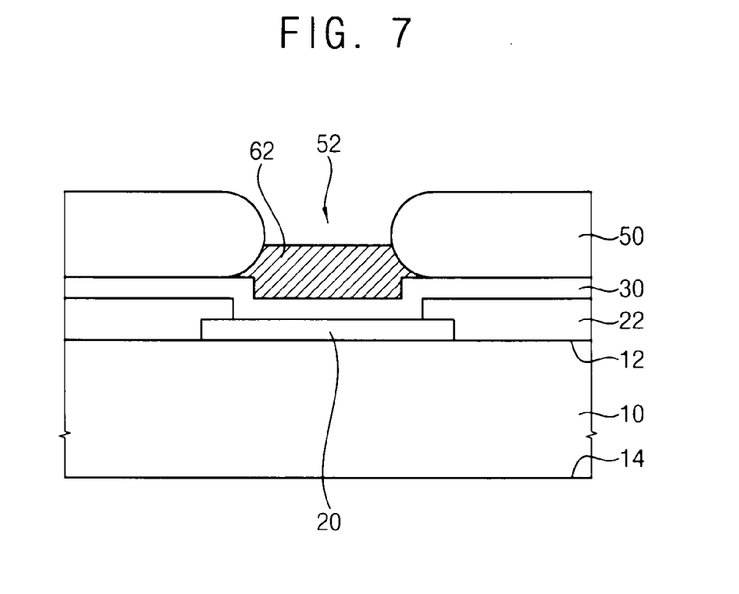
Figure 8:
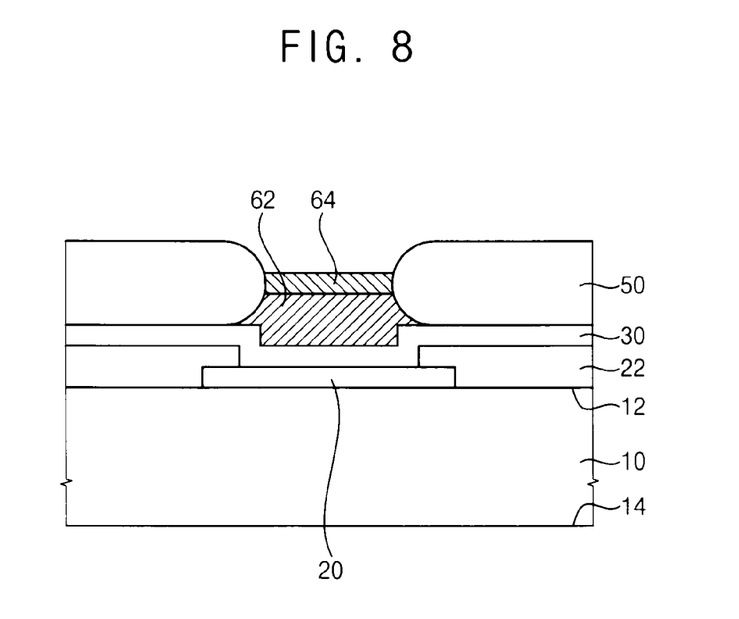
Figure 9:
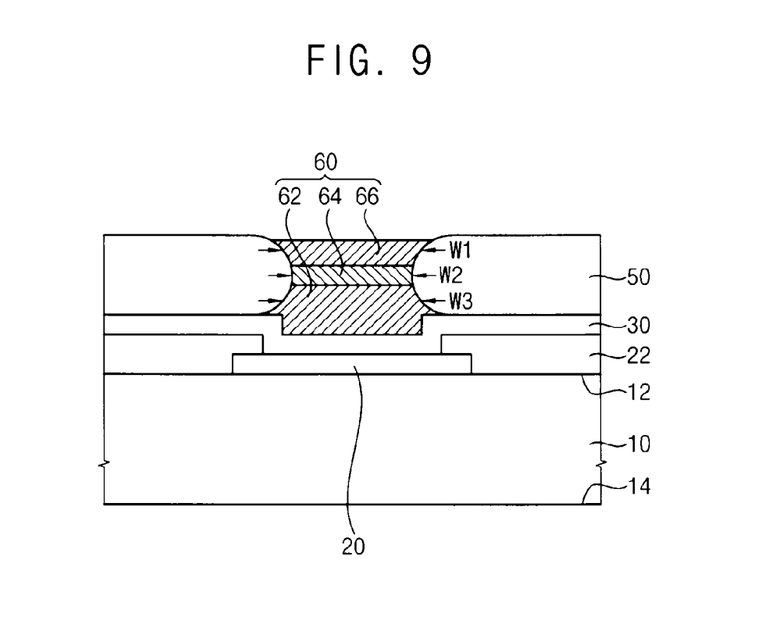

Referring to FIGS. 7 through 9, a first bump 60 may be formed on the connection pad 20 of the substrate 10.

The opening 52 of the photoresist layer pattern 50 may be filled with a conductive material to form the first bump 60.

For example, a first plating process may be performed on the seed layer 30 using a first conductive material to form a lower portion 62 of the first bump 60 having a first width (W1). A second plating process may be performed on the lower portion 62 of the first bump 60 using a second conductive material to form a middle portion 64 of the first bump 60 having a second width (W2) smaller than the first width (W1). A third plating process may be performed on the middle portion 64 of the first bump 60 using a third conductive material to form an upper portion 66 of the first bump 60 having a third width (W3) greater than the second width (W2).

The first conductive material may have a first ductility, the second conductive material may have a second ductility greater than the first ductility, and the third conductive material may have a third ductility smaller than the second ductility. The first conductive material may be substantially the same as the third conductive material.

For example, the lower portion 62 of the first bump 60 and the upper portion 66 of the first bump 60 may include copper (Cu), nickel (Ni), etc. The middle portion 64 of the first bump 60 may include tin (Sn).

Figure 10:
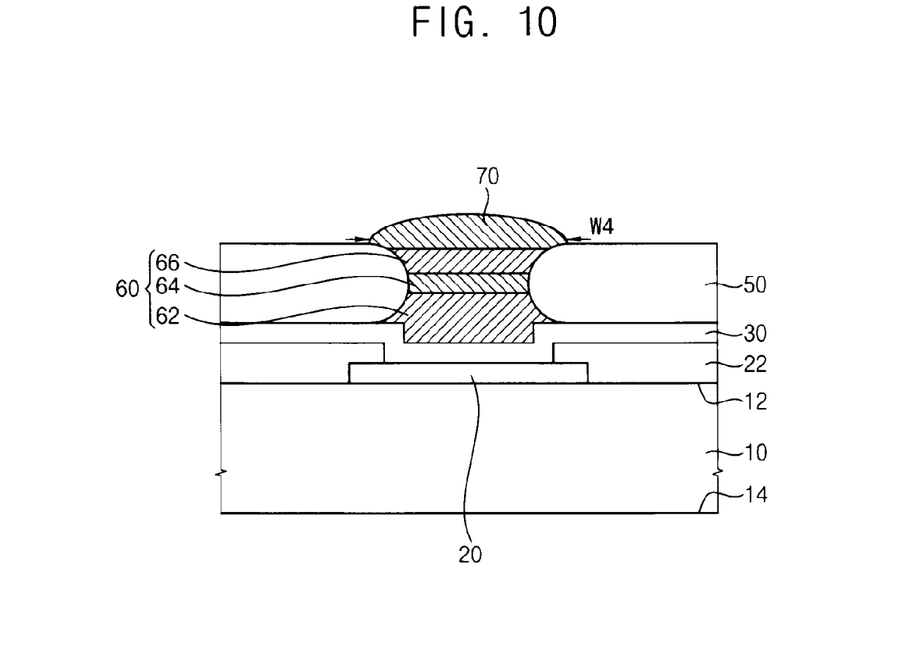
Figure 11:
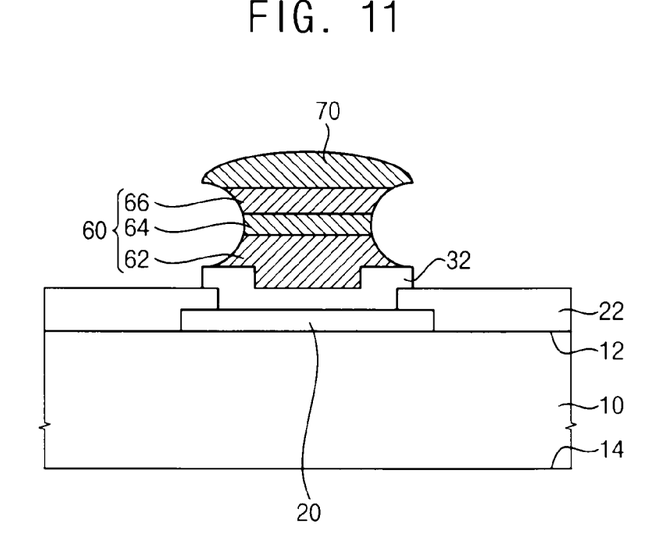

Referring to FIGS. 10 and 11, a second bump 70 may be formed on the first bump 60, and then, the photoresist layer pattern 50 may be removed from the substrate 10. Then, the seed layer 30 may be partially removed to form a seed layer pattern 32.

The second bump 70 may include a fourth conductive material. For example, the fourth conductive material may be substantially the same as the second conductive material. The second bump 70 may tin (Sn), tin/silver (Sn/Ag), tin/copper (Sn/Cu), tin/indium (Sn/In), etc.

Figure 12:
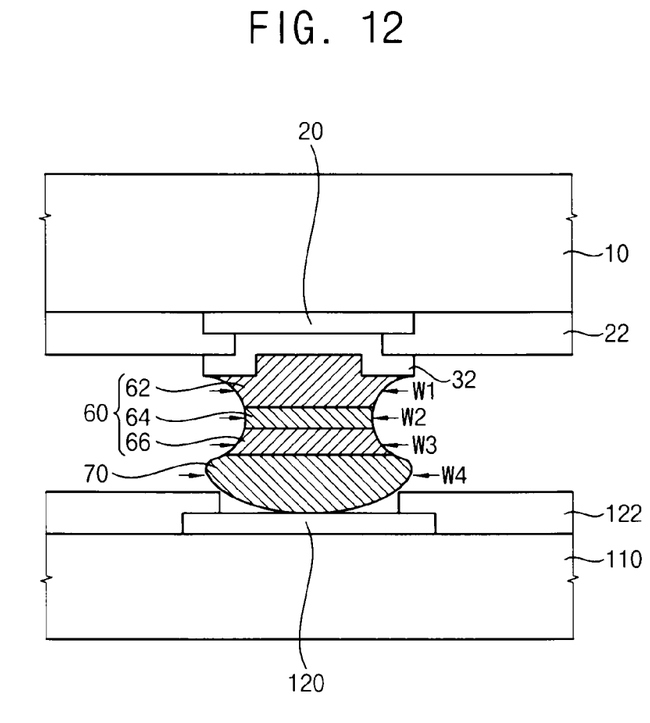

Referring to FIG. 12, after the photoresist layer pattern 50 is removed, the second bump 70 may be adhered to a connection pad 120 of a mounting substrate 110 by a reflow process.

The bump structure including the first bump 60 and the second bump 70 in FIG. 2 may be formed between the connection pad 20 of the substrate 10 and the connection pad 120 of the mounting substrate 110.

Thus, the semiconductor chip 200 may be mounted on the mounting substrate 110 using the first bump 60 and the second bump 70. The bump structure including the middle portion 64 having a width (or diameter) relatively smaller than the lower portion 62 and the upper portion 66 may be used to electrically connect a plurality semiconductor devices to each other, such as within a semiconductor chip.

Referring again to FIG. 1, a sealing member 150 may be formed on an upper surface of the mounting substrate 110 to cover the semiconductor chip 200. A solder ball 140 may be disposed on the outer connection pad 132 of the mounting substrate 110. Accordingly, the semiconductor package 100 may be mounted on a module substrate 500 via the solder balls 140 to constitute a memory module (not illustrated).

Figure 13:
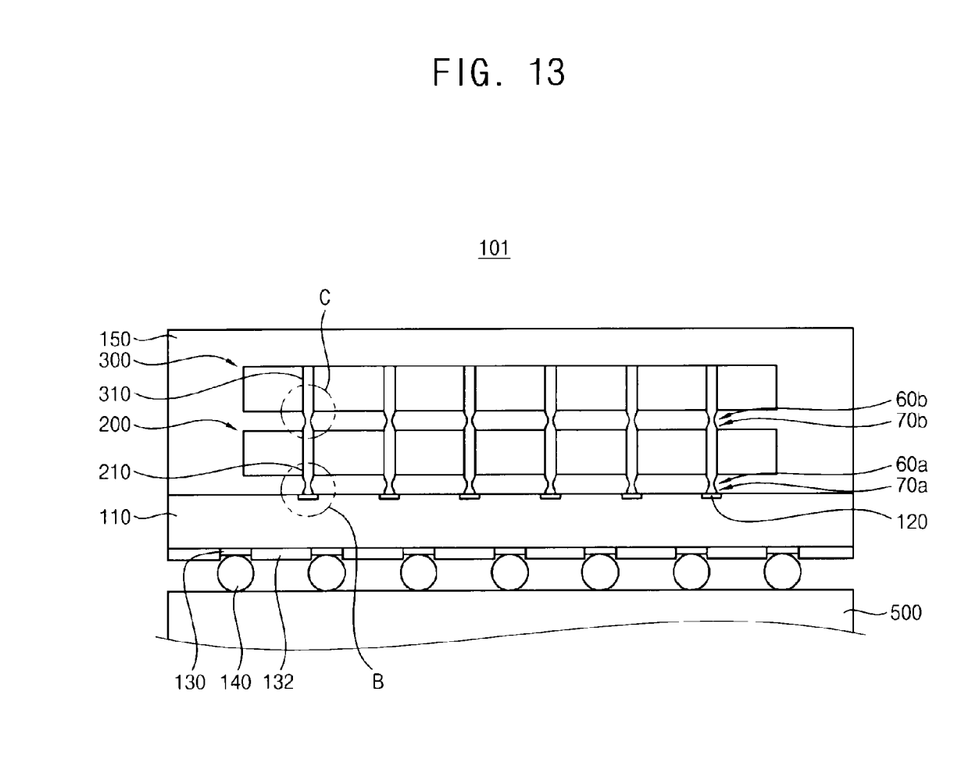
FIG. 13 is a cross-sectional view illustrating a semiconductor package in accordance with an exemplary embodiment of the present general inventive concept.
Figure 14:
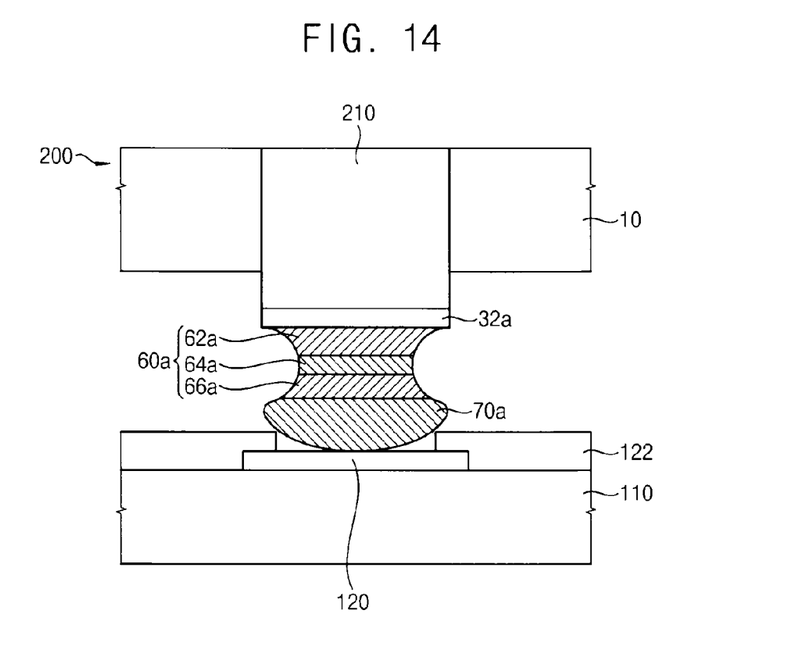
FIGS. 14 and 15 are cross-sectional views illustrating the bump structures in FIG. 13.
Figure 15:
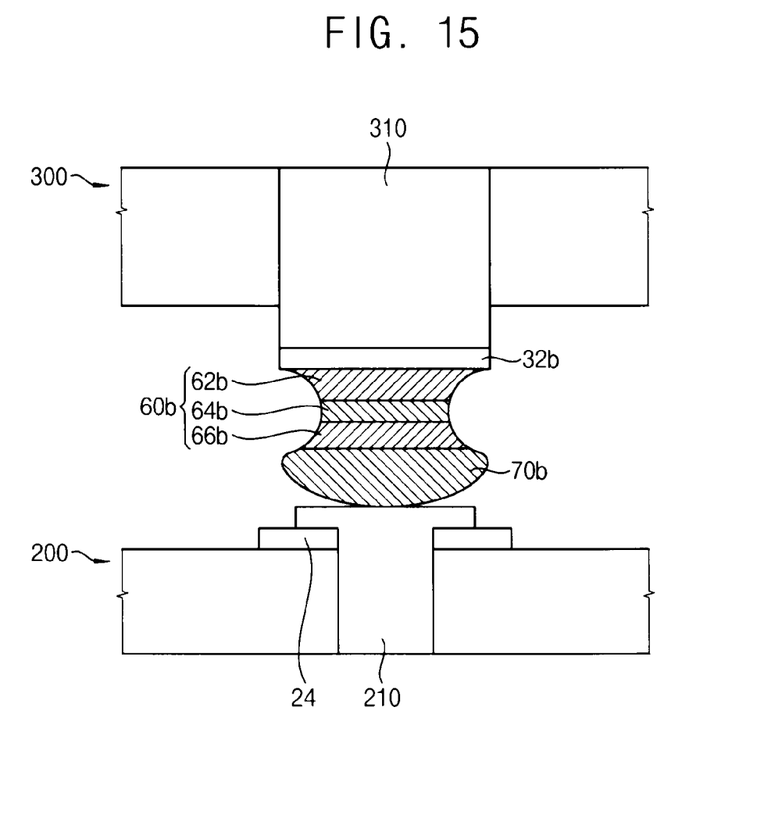

FIG. 13 is a cross-sectional view illustrating a semiconductor package 101 in accordance with an exemplary embodiment of the present general inventive concept. FIGS. 14 and 15 are cross-sectional views illustrating the bump structures in FIG. 13. FIG. 14 is an enlarged view illustrating the "B" portion in FIG. 13 and FIG. 15 is an enlarged view illustrating the "C" portion in FIG. 13. The semiconductor package 101 is substantially the same as or similar to that of FIG. 1, with an exception of a plurality of semiconductor chips stacked on each other and electrical connections therebetween. Thus, the same or like reference numerals will be used to refer to the same or like elements and any further repetitive explanation concerning the above elements will be omitted.

Referring to FIG. 13, a semiconductor package 101 includes a mounting substrate 110, first and second semiconductor chips 200 and 300, respectively stacked on the mounting substrate 110, a first bump structure connecting the mounting substrate 110 and the first semiconductor chip 200, and a second bump structure connecting the first semiconductor chip 200 and the second semiconductor chip 300.

The first semiconductor chip 200 may be mounted on and electrically connected to the mounting substrate 110 via a plurality of the first bump structures. The second semiconductor chip 300 may be stacked on and electrically connected to the first semiconductor chip 200.

The first semiconductor chip 200 may include a first plug 210 to penetrate the first semiconductor chip 200. The second semiconductor chip 300 may include a second plug 310 that penetrates the second semiconductor chip 300. A through electrode, also known as a through silicon via (TSV), may be used as the first and second plugs 210 and 310, respectively.

Referring to FIG. 14, a plurality of the first bump structures may be used to provide electrical connections between the first semiconductor chip 200 and the mounting substrate 110. The first bump structure may be substantially the same as the bump structure according to the exemplary embodiments of the present general inventive concept as described above with reference to FIG. 1.

Accordingly, the first bump structure may include a first bump 60a and a second bump 70a. The first bump 60a may be disposed on the first plug 210 to penetrate the first semiconductor chip 200 and the second bump 70a may be disposed on the first bump 60a and adhered to a connection pad 120 of the mounting substrate 110.

The first bump 60a may include a lower portion 62a, a middle portion 64a and an upper portion 66a extending in a stacking direction from the first plug 210. The middle portion 64a of the first bump 60a may have a width (diameter) smaller than those of the lower portion 62a and the upper portion 66a. The second bump 70a may have a width (diameter) greater than that of the middle portion 64a of the first bump 60a.

The middle portion 64a of the first bump 60a may include a conductive material different from the lower portion 62a and the upper portion 66a. The middle portion 64a of the first bump 60a may have ductility greater than those of the lower portion 62a and the upper portion 66a.

A seed layer pattern 32a may be formed between the first plug 210 and the lower portion 62a.

Referring to FIG. 15, a plurality of the second bump structures may be used to provide electrical connections between the second semiconductor chip 300 and the first semiconductor chip 200. The second bump structure may be substantially the same as the bump structure according to the exemplary embodiments of the present general inventive concept as described above with reference to FIG. 1.

Accordingly, the second bump structure may include a first bump 60b and a second bump 70b. The first bump 60b may be disposed on the second plug 310 to penetrate the second semiconductor chip 300 and the second bump 70b may be disposed on the first bump 60b and adhered to the first plug 210 that penetrates the first semiconductor chip 200.

The first bump 60b may include a lower portion 62b, a middle portion 64b and an upper portion 66b extending in a stacking direction from the second plug 310. The middle portion 64b of the first bump 60b may have a width (diameter) smaller than those of the lower portion 62b and the upper portion 66b. The second bump 70b may have a width (diameter) greater than that of the middle portion 64b of the first bump 60b.

The middle portion 64b of the first bump 60b may include a conductive material different from the lower portion 62b and the upper portion 66b. The middle portion 64b of the first bump 60b may have ductility greater than those of the lower portion 62b and the upper portion 66b.

A seed layer pattern 32b may be formed between the second plug 310 and the lower portion 62b.

The first plug 210 may be formed in a region corresponding to a connection pad 24 of the first semiconductor chip 200 such that the first plug 210 penetrates the connection pad 24 of the first semiconductor chip 200. Alternatively, a redistribution pad (not illustrated) may be formed on a surface of a substrate 10 to be electrically connected to the connection pad 24, and the first plug 210 may penetrate the redistribution pad.

Hereinafter, a method of manufacturing the semiconductor package 101 as illustrated in FIG. 13 will be explained.

First, a first semiconductor chip 200 including a first plug 210 formed therein and a second semiconductor chip 300 including a second plug 310 formed therein are prepared.

A first bump structure including a first bump 60a and a second bump 70a may be disposed on the first plug 210. The first bump structure may be formed by performing the processes described with reference to FIGS. 3 through 11.

Then, the second bump 70a may be adhered to a connection pad 120 of a mounting substrate 110 by a reflow process such that the first semiconductor chip 200 may be mounted on the mounting substrate 110. Similarly, the second semiconductor chip 300 may be stacked on the first semiconductor chip 200 via the second bump structures.

A sealing member 150 may be formed on an upper surface of the mounting substrate 110 to cover the first and second semiconductor chips 200 and 300, respectively. Solder balls 140 may be disposed on a plurality of outer connection pads 130 on a lower surface of the mounting substrate 110. Accordingly, the semiconductor package 101 may be mounted on a module substrate 500 via the solder balls 140 to constitute a memory module (not illustrated).

Figure 16:
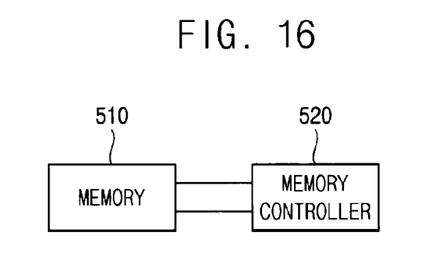
FIG. 16 illustrates another exemplary embodiment of the present general inventive concept.

FIG. 16 illustrates another exemplary embodiment of the present general inventive concept.

As illustrated in FIG. 16, this embodiment includes a memory 510 connected to a memory controller 520. The memory 510 may include the memory device discussed above. The memory controller 520 supplies input signals to control an operation of the memory 510.

Figure 17:
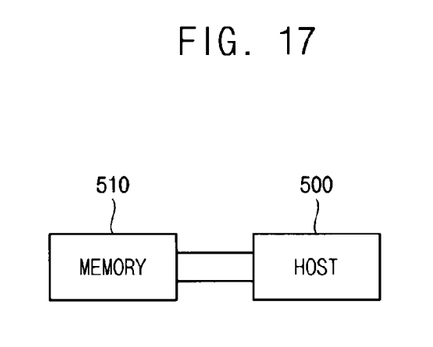
FIG. 17 illustrates another exemplary embodiment of the present general inventive concept.

FIG. 17 illustrates another exemplary embodiment of the present general inventive concept.

Referring to FIG. 17, this embodiment includes a memory 510 connected with a host system 500. The memory 510 may include the memory device discussed above.

The host system 500 may include an electrical system such as a personal computer, digital camera, mobile application, game machine, communication equipment, etc., but is not limited thereto. The host system 500 supplies the input signals to control an operation of the memory 510. The memory 510 is used as a data storage medium.

Figure 18:
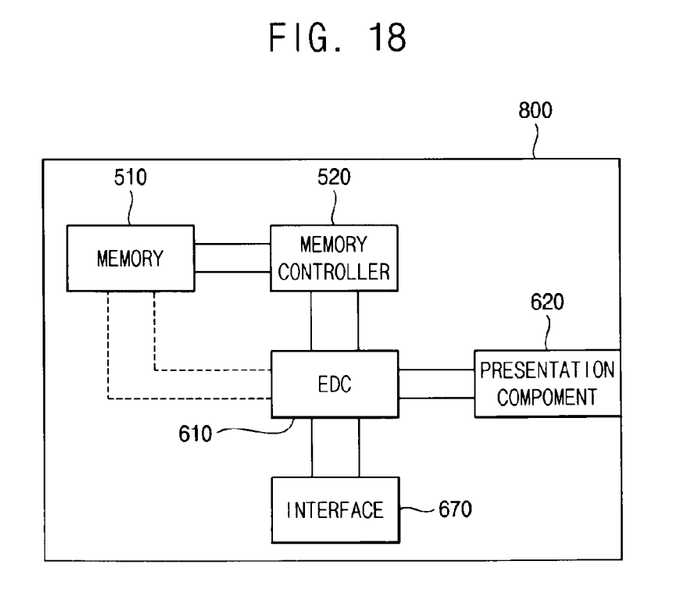
FIG. 18 illustrates another exemplary embodiment of the present general inventive concept.

FIG. 18 illustrates another exemplary embodiment of the present general inventive concept. This embodiment represents a portable device 800. The portable device 800 may be an MP3 player, video player, combination video and audio player, etc. As illustrated, the portable device 800 may include the memory 510 and memory controller 520. The memory 510 may include the memory device discussed above. The portable device 800 may also include an encoder/decoder EDC 610, a presentation component 620, and an interface 670. Data (e.g., video, audio, etc.) may be input and/or output to and/or from the memory 510 via the memory controller 520 by the EDC 610.

As mentioned above, a bump structure according to exemplary embodiments of the present general inventive concept may be provided to be used as an electrical connection member in semiconductor devices, and may include connection pads with fine pitches. The bump structure may include a first bump and a second bump on an upper portion of the first bump. A middle portion of the first bump may have a width (diameter) relatively smaller than those of a lower portion and the upper portion of the first bump. The middle portion of the first bump may have a ductility that is relatively greater than those of the lower portion and the upper portion of the first bump.

Accordingly, when a tensile stress is exerted on the bump structure in an extending direction, the tensile stress may be transferred to concentrate on the middle portion of the first bump having a relatively small width (diameter) and then may be absorbed in the middle portion of the first bump having a relatively excellent ductility.

Therefore, a stress generated during manufacturing processes may be prevented from concentrating on an end portion of the bump structure that is connected to the connection pad of the semiconductor device, and further, heat or impact may be prevented from being transferred under the connection pad through the end portion of the first bump including copper. Thus, cracking or peeling of the connection pad may be prevented to thereby improve electrical and mechanical reliability of the semiconductor package.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A bump structure, comprising:
a first bump disposed on a connection pad of a substrate such that outermost lateral sides of the first bump form a concave shape, the first bump comprising:
a lower portion comprising a first conductive material having a first width such that outermost lateral sides of the lower portion form a first part of the concave shape,
a middle portion comprising a second conductive material different from the first conducting material having a second width smaller than the first width such that outermost lateral sides of the middle portion form a second part of the concave shape, and
an upper portion comprising a third conductive material different from the second conducting material having a third width greater than the second width such that outermost lateral sides of the upper portion form a third part of the concave shape; and
a second bump disposed on the upper portion of the first bump.

2. The bump structure of claim 1, wherein the first conductive material has a first ductility, the second conductive material has a second ductility greater than the first ductility, and the third conductive material has a third ductility smaller than the second ductility.

3. The bump structure of claim 1, wherein the first conductive material is substantially the same as the third conductive material.

4. The bump structure of claim 3, wherein the first conductive material and the third conductive material comprise copper (Cu).

5. The bump structure of claim 4, wherein the second conductive material comprises tin (Sn).

6. The bump structure of claim 1, wherein the second bump comprises a fourth conductive material substantially the same as the second conductive material.

7. The bump structure of claim 1, wherein the second bump has a fourth width greater than the second width.

8. A semiconductor package, comprising:
a semiconductor chip;
a mounting substrate to mount the semiconductor chip;
a first bump disposed on a connection pad of the semiconductor chip such that outermost lateral sides of the first bump form a concave shape, the first bump comprising:
a lower portion comprising a first conductive material and extending from the connection pad and having a first width such that outermost lateral sides of the lower portion form a first part of the concave shape,
a middle portion comprising a second conductive material different from the first conducting material and having a second width smaller than the first width such that outermost lateral sides of the middle portion form a second part of the concave shape, and
an upper portion comprising a third conductive material different from the second conducting material and having a third width greater than the second width such that outermost lateral sides of the upper portion form a third part of the concave shape; and
a second bump disposed on the upper portion of the first bump and adhered to a connection pad of the mounting substrate.

9. The semiconductor package of claim 8, wherein the second conductive material has ductility greater than those of the lower portion and the upper portion of the first bump.

10. A semiconductor package, comprising:
a semiconductor chip;
a mounting substrate disposed above the semiconductor chip in a stacking direction to mount the semiconductor chip onto a module substrate;
a first bump extending from the semiconductor chip toward the mounting substrate such that outermost lateral sides of the first bump form a concave shape, the first bump comprising:
a lower portion comprising a first conductive material and extending from the semiconductor chip such that outermost lateral sides of the lower portion form a first part of the concave shape,
a middle portion comprising a second conductive material different from the first conducting material and extending from the lower portion such that outermost lateral sides of the middle portion form a second part of the concave shape, and
an upper portion comprising a third conductive material different from the second conducting material and extending from the middle portion such that outermost lateral sides of the upper portion form a third part of the concave shape; and
a second bump disposed on an end of the first bump that is furthest away from the semiconductor chip and coupled with the mounting substrate such that lateral sides of the second bump are convex.

11. The semiconductor package of claim 10, wherein the first bump has a width in the stacking direction that is larger than a width of the second bump in the stacking direction.

12. The semiconductor package of claim 10, wherein:
the lower portion has a first width;
the middle portion has a second width smaller than the first width; and
the upper portion has a third width greater than the second width.

13. The semiconductor package of claim 10, further comprising a connection pad to connect the mounting substrate to the second bump.

14. The semiconductor package of claim 10, further comprising:
a plurality of solder balls to connect the mounting substrate to the module substrate; and
a plurality of connecting pads disposed between the plurality of solder balls, respectively, and the mounting substrate to provide an electrical connection therebetween.

* * * * *